US008034532B2

(12) United States Patent
Allen et al.

(10) Patent No.: US 8,034,532 B2
(45) Date of Patent: *Oct. 11, 2011

(54) HIGH CONTACT ANGLE TOPCOAT MATERIAL AND USE THEREOF IN LITHOGRAPHY PROCESS

(75) Inventors: Robert David Allen, San Jose, CA (US); Phillip Joe Brock, Sunnyvale, CA (US); Carl E. Larson, San Jose, CA (US); Ratnam Sooriyakumaran, San Jose, CA (US); Linda Karin Sundberg, Los Gatos, CA (US); Hoa D Truong, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 621 days.

This patent is subject to a terminal disclaimer.

(21) Appl. No.: 11/380,744

(22) Filed: Apr. 28, 2006

(65) Prior Publication Data

US 2007/0254236 A1  Nov. 1, 2007

(51) Int. Cl.
*G03F 7/11* (2006.01)
*G03F 7/20* (2006.01)
*G03F 7/30* (2006.01)
*G03F 7/36* (2006.01)
*C08F 14/18* (2006.01)

(52) U.S. Cl. ......... 430/270.1; 430/271.1; 430/272.1; 430/273.1; 430/311; 430/313; 430/325; 430/326; 430/330; 430/907; 430/910; 526/242; 526/245; 526/248; 526/279; 526/281; 526/282; 526/288; 526/328; 526/328.5; 526/329.4; 556/9; 556/12

(58) Field of Classification Search .............. None
See application file for complete search history.

(56) References Cited

U.S. PATENT DOCUMENTS

| | | | |
|---|---|---|---|
| 3,981,987 | A | 9/1976 | Linke et al. |
| 4,189,323 | A | 2/1980 | Buhr |
| 4,255,299 | A | 3/1981 | Daimon et al. |
| 4,395,566 | A | 7/1983 | Covill et al. |
| 4,472,494 | A | 9/1984 | Hallman et al. |
| 4,551,519 | A | 11/1985 | Oxenrider |
| 4,647,651 | A | 3/1987 | Oxenrider |
| 4,731,605 | A | 3/1988 | Nixon |

(Continued)

FOREIGN PATENT DOCUMENTS

WO  WO 02/16517 A2 *  2/2002

(Continued)

OTHER PUBLICATIONS

Huang et al ("New 193nm Top Antireflective Coatings for Superior Swing Reduction", Proceedings of SPIE, vol. 6153, 61530S-1-61530S-8 (2006)).*

(Continued)

*Primary Examiner* — Sin J. Lee
(74) *Attorney, Agent, or Firm* — Norris McLaughlin & Marcus P.A.

(57) ABSTRACT

A topcoat material for application on top of a photoresist material is disclosed. The topcoat material comprises an acid-inert compound. The topcoat material also comprises a polymer or an oligomer or a cage structure which shows negligible intermixing with the imaging layer and is soluble in aqueous base developer. A method of forming a patterned material layer on a substrate and a coated substrate comprising the topcoat material is also disclosed.

17 Claims, 8 Drawing Sheets

U.S. PATENT DOCUMENTS

| | | | |
|---|---|---|---|
| 5,240,812 | A | 8/1993 | Conley et al. |
| 5,580,694 | A | 12/1996 | Allen et al. |
| 5,595,861 | A | 1/1997 | Garza |
| 5,679,495 | A | 10/1997 | Yamachika et al. |
| 5,744,537 | A | 4/1998 | Brunsvold et al. |
| 5,879,853 | A | 3/1999 | Azuma |
| 6,057,080 | A | 5/2000 | Brunsvold et al. |
| 6,191,476 | B1 | 2/2001 | Takahashi et al. |
| 6,274,295 | B1 | 8/2001 | Dammel et al. |
| 6,835,269 | B1 | 12/2004 | Miharu et al. |
| 6,844,134 | B2 | 1/2005 | Choi et al. |
| 7,067,231 | B2 | 6/2006 | Harada et al. |
| 7,094,850 | B2 * | 8/2006 | Miyazawa et al. ............ 526/245 |
| 7,399,581 | B2 * | 7/2008 | Allen et al. .................. 430/325 |
| 7,521,172 | B2 | 4/2009 | David et al. |
| 2001/0006736 | A1 | 7/2001 | Kuroda et al. |
| 2002/0168581 | A1 | 11/2002 | Takeda et al. |
| 2002/0182541 | A1 | 12/2002 | Gonsalves |
| 2003/0224283 | A1 | 12/2003 | Allen et al. |
| 2004/0013980 | A1 | 1/2004 | Hatakeyama et al. |
| 2004/0137362 | A1 | 7/2004 | De et al. |
| 2004/0166436 | A1 | 8/2004 | Rhodes et al. |
| 2004/0242821 | A1 | 12/2004 | Hatakeyama et al. |
| 2004/0265735 | A1 | 12/2004 | Lee |
| 2005/0010012 | A1 | 1/2005 | Jost et al. |
| 2005/0014090 | A1 | 1/2005 | Hirayama et al. |
| 2005/0079443 | A1 | 4/2005 | Noda et al. |
| 2005/0089792 | A1 | 4/2005 | Huang et al. |
| 2005/0106494 | A1 | 5/2005 | Huang et al. |
| 2005/0147920 | A1 | 7/2005 | Lin et al. |
| 2005/0153236 | A1 * | 7/2005 | Lim et al. ................... 430/270.1 |
| 2005/0164502 | A1 | 7/2005 | Deng et al. |
| 2005/0186516 | A1 | 8/2005 | Endo et al. |
| 2005/0233254 | A1 * | 10/2005 | Hatakeyama et al. ........ 430/311 |
| 2005/0250898 | A1 | 11/2005 | Maeda et al. |
| 2005/0266354 | A1 | 12/2005 | Li et al. |
| 2006/0008748 | A1 | 1/2006 | Inabe et al. |
| 2006/0029884 | A1 * | 2/2006 | Hatakeyama et al. ..... 430/270.1 |
| 2006/0105269 | A1 | 5/2006 | Khojasteh et al. |
| 2006/0177765 | A1 | 8/2006 | Harada et al. |
| 2006/0188804 | A1 | 8/2006 | Allen et al. |
| 2006/0246373 | A1 | 11/2006 | Wang |
| 2007/0254235 | A1 | 11/2007 | Allen et al. |
| 2007/0269734 | A1 * | 11/2007 | Kimura et al. ................ 430/133 |
| 2008/0038661 | A1 * | 2/2008 | Chiba et al. ................ 430/270.1 |
| 2009/0181322 | A1 | 7/2009 | Ito et al. |

FOREIGN PATENT DOCUMENTS

| | | | |
|---|---|---|---|
| WO | WO 2005/069076 A1 * | 7/2005 | |
| WO | WO2006/035790 A1 * | 4/2006 | |

OTHER PUBLICATIONS

Office Action (mail date Dec. 1, 2009) for U.S. Appl. No. 11/380,731, filed Apr. 28, 2006.

Office Action (mail date Apr. 21, 2008) for U.S. Appl. No. 11/380,782, filed Apr. 28, 2006.

Office Action (mail date Aug. 7, 2008) for U.S. Appl. No. 11/380,731, filed Apr. 28, 2006.

M. Slezak "Exploring the needs and tradeoffs for immersionresist topcoating", Solid State Technology, vol. 47, Issue 7, Jul. 2004.

A. Hand, "Tricks with water and light: 193 nm Extension"; Semiconductor International, vol. 27, Issue 2, Feb. 2004.

E. Reichmanis, et al.; "Chemical amplification mechanisms for microlithography" Chemistry of materials 1991 v. 3 p. 394-407.

Allen, Robert D. et al.; "Design of Protective Topcoats for Immersion Lithography" Journal of photopolymer science and technology 2005 v. 18 n. 5 p. 615-619.

Eds. Thompson et al., Introduction to Microlithography, Washington, DC, American Chemical Society (1994).

Sanders, Daniel P, et al; Fluoroalcohol materials with tailored interfacial properties for immersion lithography; Proceedings of the SPIE ; vol. 6519; 651904-1, (Apr. 2007).

Hiroshi Ito, Advances in Polymer Science 2005, v. 172, p. 37-245, Chemical Amplification Resists for Microlithography.

Office Action issued on Jan. 7, 2009 by Examiner for corresponding U.S. Appl. No. 11/380,731.

* cited by examiner

HIGH CONTACT ANGLE TOPCOAT MATERIAL AND USE THEREOF IN LITHOGRAPHY PROCESS

BACKGROUND OF THE INVENTION

1. Field of the Invention

The present invention relates to the fields of chemistry, photolithography and semiconductor fabrication. More specifically, the invention is directed to a composition of a high contact angle topcoat material and a method of forming a photolithographic image using the topcoat, where a liquid such as water is interposed between the last lens fixture of an exposure tool and the photoresist-coated wafer.

2. Description of Related Art

The continuous drive to print smaller structures for advanced electronic device manufacturing requires the use of higher resolution optical lithography tools. Immersion lithography has the potential to extend current 193 nm argon fluoride-based technology to 45 nm critical dimensions (half-pitch DRAM) and beyond by effectively improving the depth-of-focus processing window for a given optical numerical aperture (NA). In addition, it enables lens designs with NA greater than 1.0, thus resulting in an increased resolution of optical scanners. The process requires filling the gap between the last lens element of the exposure tool and the resist-coated substrate with ultrapure water or another suitable fluid. See A. Hand, "Tricks With Water and Light: 193 nm Extension", Semiconductor International, Vol. 27, Issue 2, February 2004.

One of the technical challenges facing liquid immersion lithography is the diffusion between the photoresist components and the immersion medium. That is, during the immersion lithographic process, the photoresist components leach into the immersion medium and the immersion medium permeates into the photoresist film. Such diffusion is detrimental to photoresist performance and might result in disastrous lens damage or contamination in a 40 million dollar lithography tool. Therefore, there is a need for a method to prevent interaction between photoresist layers and immersion fluid in an immersion lithography system.

Topcoat materials can be applied on top of the photoresist layer for the purpose of eliminating diffusion of materials from the photoresist layer underneath, and to prevent the permeation of the exposure medium into the photoresist film. Traditionally, topcoat materials have been used in photolithography as anti-reflective films on top of a photoresist. The top anti-reflective coat (TARC) materials can prevent the multiple interference of light that takes place within the photoresist layer during exposure. As a result, the critical dimension (CD) variation of the geometrical features of a photoresist pattern caused by the variation in the thickness of the photoresist film can be reduced.

For ease of processing, classic TARC materials are designed to be soluble in both water and aqueous base developers so that they can be applied directly from water solution and subsequently removed by the aqueous base developer during the develop stage.

Numerous TARC materials have been developed previously. For example, U.S. Pat. Nos. 5,744,537 and 6,057,080 disclose aqueous-soluble TARC materials comprising a polymeric binder and a fluorocarbyl compound, which have nearly ideal refractive indices on the order of 1.3-1.4. U.S. Pat. No. 5,879,853 also discloses a TARC material that is removable by a wet process. U.S. Pat. No. 5,595,861 similarly discloses a TARC comprising partially fluorinated compounds, which can also be water soluble. U.S. Pat. No. 6,274,295 discloses a TARC material comprising a light-absorbing compound having a wavelength of maximum absorption higher than an exposure wavelength used to expose the photoresist. This TARC can also be water-soluble. Finally, U.S. Pat. No. 5,240,812 discloses a protective material for use as an overcoat film for acid catalyzed resist compositions to prevent contamination from vapors of organic and inorganic bases. While not specifically disclosed as being a TARC, the overcoat can also be water-soluble.

Since water has been proposed as the exposure medium for 193 nm immersion lithography, classic water-soluble TARC materials such as those described above cannot be used as topcoats for such technology. Other commercial materials currently available either require solvents that are incompatible with semiconductor fabrication lines or impact the lithographic performance of the photoresist. New topcoat materials are needed to ensure the deployment of 193 nm immersion lithography necessary for manufacture of semiconductor devices at 45 nm and below design ground rules. See M. Slezak, "Exploring the needs and tradeoffs for immersion resist topcoating", Solid State Technology, Vol. 47, Issue 7, July 2004.

At IBM, organic polymer-based topcoats or hybrid (organic-inorganic) molecular topcoats are being developed. This is a new area of exploration and there is a need to develop a variety of topcoats that are compatible with different resists, or ultimately functions as universal topcoats. A critical deficiency of most of the reported base soluble topcoats is that they have relatively high surface energy, resulting in a "low" water contact angle (in the range of 70-80 degrees). It has been reported low surface energy (contact angle greater than 90° C.) topcoats may be important for high-speed scanning and low defectivity in immersion lithography. If immersion lithography realizes its potential as a successor to dry 193 nm lithography in volume production, the combination of high speed scanning and low defectivity are essential.

In fact, the first working topcoats were based on Teflon-AF-like Fluoropolymers and have very low surface energy and have water contact angles in the 110-120 degree range. However, these topcoats were not developable in aqueous base and led to involved/expensive/impractical processing.

Thus, there remains a need for a topcoat material that is highly soluble in developer, resistant to immersion fluid, compatible with photoresist, and has low surface energy with water contact angle greater than 90° C.

SUMMARY OF THE INVENTION

Accordingly, the present invention is directed to a low surface energy topcoat material for application on top of a photoresist material. The topcoat material comprises a polymer or an oligomer or a cage structure which shows negligible intermixing with the imaging layer and is soluble in aqueous base developer.

The material of the present invention contains a fluorocarbyl functionality in order to lower the surface energy and an acidic functionality which makes it aqueous base soluble. This acid-inert (does not have acid-labile groups) material has the following general structure (A):

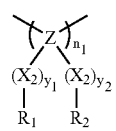

A wherein
Z represents a unit of a polymer, oligomer or cage structure;
$n_1$ is an integer $\geq 1$ representing the number of repeat units;
each $X_1$ and $X_2$ independently represents a member selected from the group consisting of linear, branched or cyclic alkylene, linear, branched or cyclic heteroalkylene, carboxyl and carbonyl;
each $y_1$ and $y_2$ independently is either 0 or 1;

$R_1$ represents a fluorocarbyl moiety other than a fluorinated ether; and $R_2$ represents an aqueous base soluble group comprising a functionality selected from the group consisting of hydrogen, carboxyl, sulfonamidyl, fluoroalcohol and sulfonic acid.

In another aspect, the invention is directed to a topcoat composition which comprises at least one of the compounds above and at least one solvent.

In another aspect, the invention is directed to a method of forming a patterned material layer on a substrate, the method comprising the following steps:
a) providing a substrate having a material layer on a surface thereof;
b) depositing a photoresist composition on the substrate to form a photoresist layer on the material;
c) applying the topcoat composition over the photoresist layer, thereby forming a coated substrate;
d) patternwise exposing the coated substrate to imaging radiation;
e) optionally post-exposure baking of said coated substrate;
f) contacting the coated substrate with an aqueous alkaline developer, whereby the topcoat composition and a portion of the photoresist layer are removed from the coated substrate, thereby forming a pattern in the photoresist layer; and
g) transferring the pattern in the photoresist layer to the material layer.

In another aspect, the invention is directed to a coated substrate which is formed by the method above. The coated substrate comprises:
a) a substrate having a material layer on a surface thereof;
b) a photoresist layer formed on the material; and
c) the inventive topcoat composition applied to the photoresist layer.

BRIEF DESCRIPTION OF THE DRAWINGS

The invention will now be described in greater detail with reference to the drawings, wherein.

DETAILED DESCRIPTION OF THE INVENTION

Figure 1A:
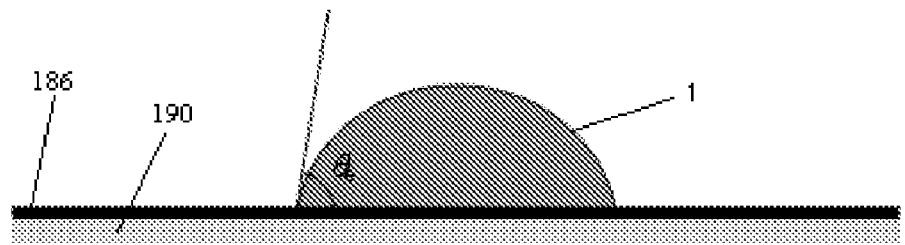
FIG. 1A is a picture depicting a static contact angle $\theta_e$ when all three phases, air, water and resist film, have reached their natural equilibrium positions.

The present invention is directed to a topcoat material comprising a compound which includes a polymer or an oligomer or a cage structure, and which is soluble in an aqueous alkaline developer and at least one solvent. The topcoat is preferably highly soluble in an aqueous base developer but insoluble in water so that it can be used for 193 nm immersion lithography.

In one embodiment, the compound includes a polymer or oligomer having the structure A1:

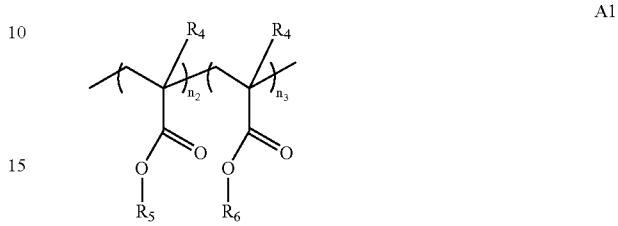

wherein
$R_3$ and $R_4$ independently represent a member selected from the group consisting of hydrogen, alkyl and fluoroalkyl;
$R_5$ represents an aqueous base soluble group comprising a functionality selected from the group consisting of hydrogen, sulfonamidyl and fluoroalcohol;
$R_6$ represents a fluorocarbyl moiety other than a fluorinated ether; and
$n_2$ and $n_3$ are integers that represent the number of repeat units.

In another embodiment, the compound includes a polymer or oligomer having the structure A2:

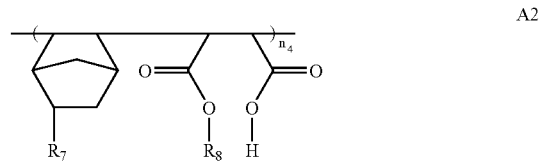

wherein
$R_7$ and $R_8$ independently represent a member selected from the group consisting of hydrogen and a fluorocarbyl moiety other than a fluorinated ether, provided that one of $R_7$ and $R_8$ is a fluorocarbyl moiety other than a fluorinated ether; and
$n_4$ is an integer that represents the number of repeat units.

In a third embodiment, the compound includes a polymer or oligomer having the structure A3:

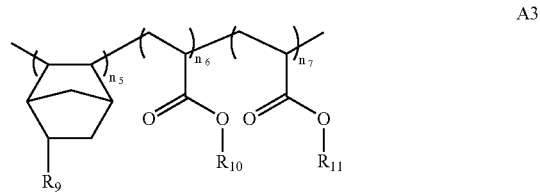

wherein
$R_9$ and $R_{10}$ independently represent a member selected from the group consisting of hydrogen and a fluorocarbyl moiety other than a fluorinated ether, provided that one of $R_9$ and $R_{10}$ is a fluorocarbyl moiety other than a fluorinated ether;
$R_{11}$ represents an aqueous base soluble group comprising a functionality selected from the group consisting of hydrogen, sulfonamidyl and fluoroalcohol; and
$n_5$, $n_6$ and $n_7$ are integers that represent the number of repeat units.

In a fourth embodiment, the compound includes a polymer or oligomer having the structure A4:

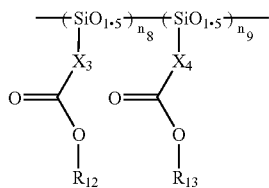
A4 wherein $X_3$ and $X_4$ independently represent a member selected from the group consisting of alkylene, cycloalkylene, heteroalkylene and heterocycloalkylene;

$R_{12}$ represents an aqueous base soluble group comprising a functionality selected from the group consisting of hydrogen, sulfonamidyl and fluoroalcohol;

$R_{13}$ represents a fluorocarbyl moiety other than a fluorinated ether; and $n_8$ and $n_9$ are integers that represent the number of repeat units.

In a fifth embodiment, the compound includes a polymer or oligomer or a cage structure having the structure A5:

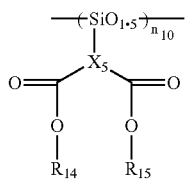
A5 wherein $X_5$ represents an alicyclic group;

$R_{14}$ represents an aqueous base soluble group comprising a functionality selected from the group consisting of hydrogen, sulfonamidyl and fluoroalcohol;

$R_{15}$ represents a fluorocarbyl moiety other than a fluorinated ether; and $n_{10}$ is an integer that represents the number of repeat units.

In a sixth embodiment, the compound includes a cage structure.

In a particularly preferred embodiment, the compound includes a compound selected from the group consisting of compounds of the formula:

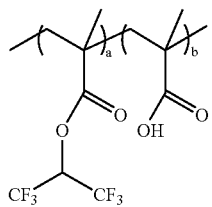

wherein a:b=0-70 mole %:100-30 mole %, and a+b=100 mole %; as exemplified by:

Polymer 1 (a:b=50:50);
Polymer 2 (a:b=60:40);
and compounds of the formula:

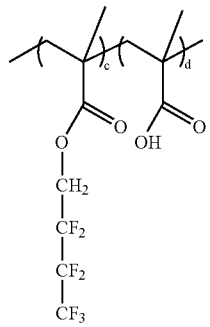

wherein c:d=0-70 mole %:100-30 mole %, and c+d=100 mole %; as exemplified by:

Polymer 3 (c:d=70:30);
and compounds of the formula:

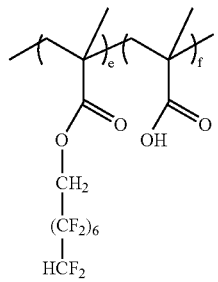

wherein e:f=0-70 mole %:100-30 mole %, and e+f=100 mole %; as exemplified by:

Polymer 4 (e:f=70:30);
and compounds of the formula:

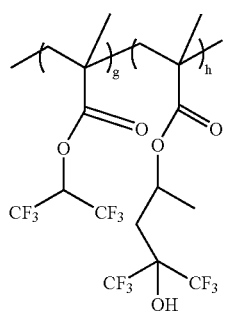

wherein g:h=0-20 mole %:100-80 mole %, and g+h=100 mole %; as exemplified by:

Polymer 5 (g:h=5:95);

and compounds of the formula:

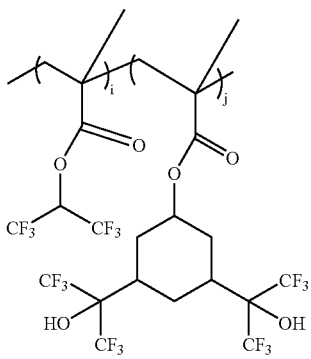

wherein i:j=0-50 mole %:100-50 mole %, and i+j=100 mole %; as exemplified by:
  Polymer 6 (i:j=50:50);
  Polymer 7 (i:j=40:60);
  Polymer 8 (i:j=30:70);
and compounds of the formula:

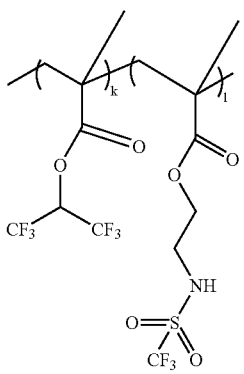

wherein k:l=0-50 mole %: 100-50 mole %, and i+j=100 mole %; as exemplified by:
  Polymer 9 (k:l=50:50);
  Polymer 10 (k:l=40:60);
  Polymer 11 (k:l=30:70);
and compounds of the formula:

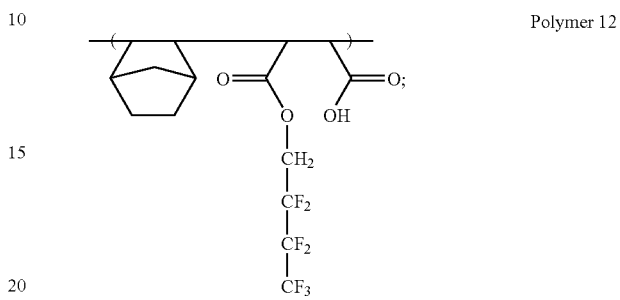

Polymer 12 and compounds of the formula:

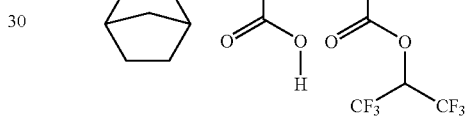

wherein m:n:o=0-20 mole %: 20-80 mole %: 60-0 mole %, and m+n+o=100 mole %; as exemplified by:
  Polymer 13 (m:n:o=20:48:32); and
the compound of the formula:

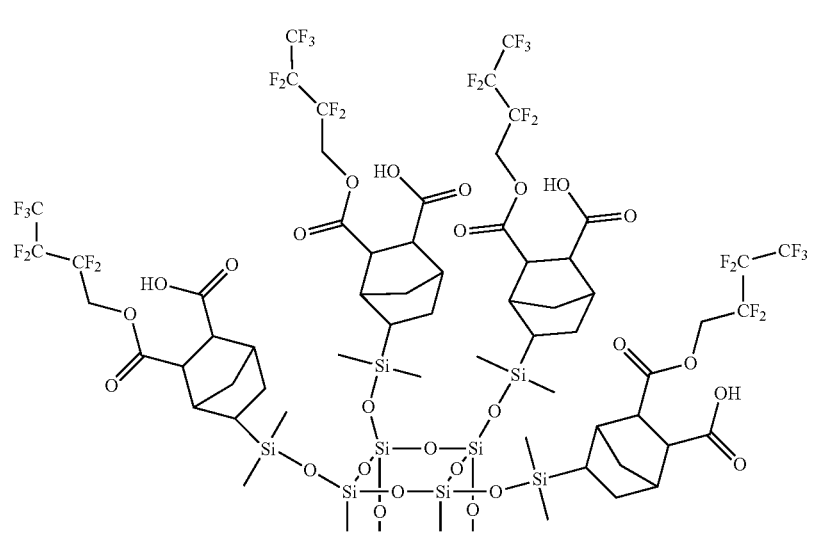

Cage Compound 1

-continued

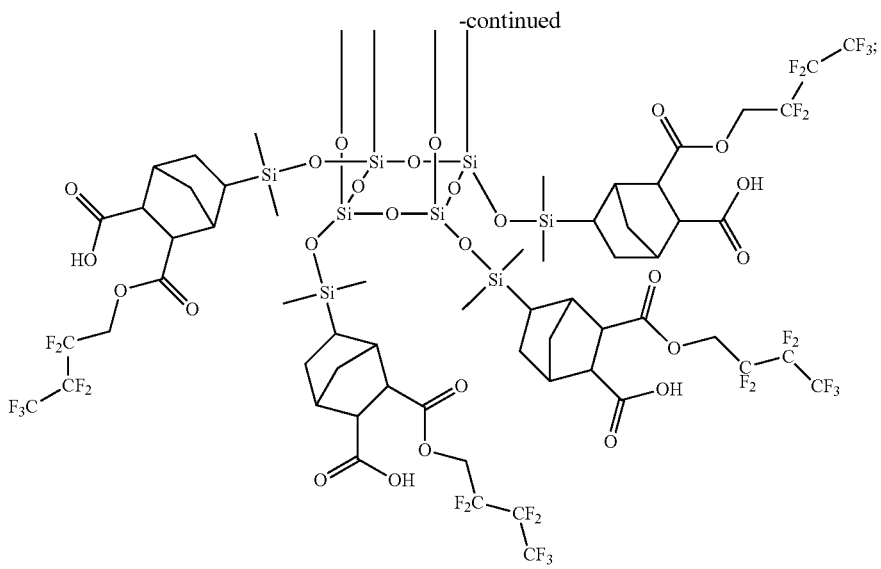

wherein a, b, c, . . . o each represent a number of repeat units.

The topcoat formulation is composed of one or more of the materials described above and at least one solvent, which is preferably immiscible with the underlying photoresist material. Suitable solvents include, but are not limited to: hydrocarbon alcohols, such as 1-butanol, 2,3-dimethyl-2-butanol, 1-pentanol, 4-methyl-2-pentanol, 2-ethyl hexanol, ethylene glycol, 1,2-butanediol, 1,3-butanediol, 1,4-butanediol, 1,2-propanediol, 1,3-propanediol, and other hydrocarbon alcohols having 4 to 8 carbons.

The inventive material is preferably highly soluble in an aqueous base developer but is insoluble in water, such that the topcoat material can be rapidly stripped with a conventional photoresist developer during the resist develop step. For use in thick coatings, the inventive material most preferably has such a high dissolution rate that the removal time for the thick film of the inventive coating is compatible with standard development. That is, the thick film can be stripped more rapidly than the standard development time.

Moreover, the inventive material is preferably substantially optically transparent to an appropriate wavelength of exposure radiation for the underlying photoresist material, to allow patterning of the photoresist material. For use in thick coatings, the inventive polymer is most preferably substantially optically transparent in the ultraviolet, e.g., at 193 nm.

The present invention is further directed to a coating of the inventive topcoat material on the photoresist that is thick enough to move surface bubbles, small particles and/or other contaminants out of the lithography process focal plane. This approach prevents defects from occurring during the photoresist exposure and developing steps. By "thick" it is meant a thickness of about 10-20 times that of the photoresist. A typical thickness of the topcoat material is about 1 to about 10 microns.

Since a low glass transition temperature (Tg) allows increased diffusion of photoresist components into the topcoat layer resulting in degraded imaging performance of the photoresist, the preferable topcoat materials of the present invention are materials having moderately high Tg values, in the case where the topcoat film is 'thin' (20-200 nm). On the other hand, low Tg materials are more appropriate for "thick" topcoat applications, due to the ease of removal of the casting solvent when baking the topcoat layer above its Tg temperature. It is most preferable that the topcoat material has a Tg between 60° C. and 130° C.

The present invention is directed to topcoat materials which have a low surface energy, i.e., high contact angle. The structures presented above have been characterized for static, advancing and receding contact angles. However, a reference to contact angle herein denotes the advancing water contact angle. After dissolving the material in a suitable solvent giving a solid content of 2-10%, the resulting mixture was spin cast on silicon wafers and baked at 90° C. for 60 seconds. Table 1 presents the result of these contact angle measurements.

TABLE 1

Examples of contact angles of topcoats in present invention

| Sample | Static ($\theta_e$) | Advancing ($\theta_a$) | Receding ($\theta_r$) |
|---|---|---|---|
| Polymer 1 | 96.0 | 106.0 | 45.0 |
| Polymer 2 | 98.0 | 107.0 | 52.0 |
| Polymer 3 | 101.6 | 110.3 | 64.3 |
| Polymer 4 | 99.1 | 103.8 | 65.3 |
| Polymer 5 | 85.4 | 92.0 | 72.4 |
| Polymer 6 | 86.9 | 95.7 | 70.8 |
| Polymer 7 | 82.5 | 92.0 | 66.4 |
| Polymer 8 | 79.7 | 88.9 | 64.3 |
| Polymer 9 | 96.0 | 104.0 | 68.9 |
| Polymer 10 | 92.5 | 101.6 | 64.5 |
| Polymer 11 | 88.5 | 97.8 | 61.1 |
| Polymer 12 | 87.1 | 95.5 | 52.5 |
| Polymer 13 | 91.7 | 100.4 | 44.9 |
| Cage Compound 1 | 92.0 | 103.6 | 47.6 |

EXAMPLES

The following examples are intended to provide those of ordinary skill in the art with a complete disclosure and description of how to prepare and use the compositions disclosed and claimed herein. Efforts have been made to ensure accuracy with respect to numbers (e.g., amounts, temperature, etc.), but allowance should be made for the possibility of errors and deviations. Unless indicated otherwise, parts are parts by weight, temperature is in ° C. and pressure is at or near atmospheric. Polyhedral oligomeric silsesquioxane derivatives were obtained from Hybrid Plastics. Bis (hexafluoro-2-hydroxy-2-propyl)cyclohexyl methacrylate was obtained from Central Glass (Japan). Additionally, all the other starting materials were obtained commercially or were synthesized using known procedures.

Where appropriate, the following techniques and equipment were utilized in the examples: $^1$H and $^{13}$C NMR spectra were obtained at room temperature on an Avance 400 spectrometer. Quantitative $^{13}$C NMR was run at room temperature in acetone-d6 in an inverse-gated $^1$H-decoupled mode using Cr(acac)3 as a relaxation agent on an Avance 400 spectrometer. For polymer composition analysis 19F NMR (379 MHz) spectra were also obtained using a Bruker Avance 400 spectrometer. Thermo-gravimetric analysis (TGA) was performed at a heating rate of 5° C./min in N2 on a TA Instrument Hi-Res TGA 2950 Thermogravimetric Analyzer. Differential scanning calorimetry (DSC) was performed at a heating rate of 10° C./min on a TA Instruments DSC 2920 modulated differential scanning calorimeter. Molecular weights were measured in tetrahydrofuran (THF) on a Waters Model 150 chromatograph relative to polystyrene standards. IR spectra were recorded on a Nicolet 510 FT-IR spectrometer on a film cast on a KBr plate. Optical density or absorbance measurements at 193 nm were performed using a Varian Cary Model 400 spectrometer on multiple thicknesses on quarts wafers. Film thickness was measured on a Tencor alpha-step 2000 or Nanospec. A quartz crystal microbalance (QCM) was used to study the dissolution kinetics of the resist films in an aqueous 0.26N tetramethylammonium hydroxide (TMAH) solution (CD-26). Lithographic evaluation was performed on a 0.6N 193 nm ministepper.

Figure 1B:
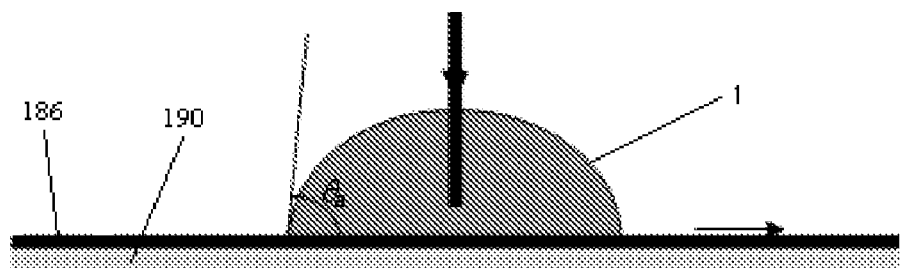
FIG. 1B is a picture depicting an advancing contact angle $\theta_a$ when volume is added to the water drop.
Figure 1C:
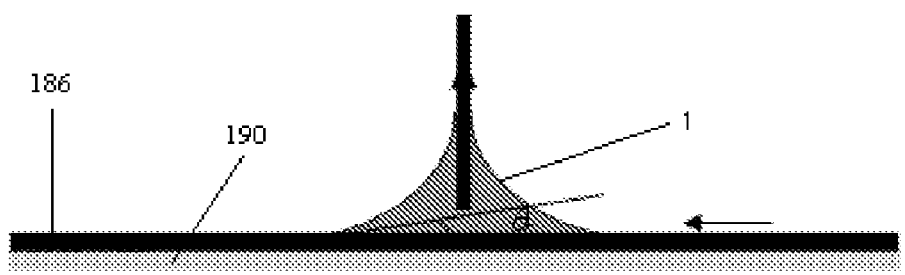
FIG. 1C is a picture depicting a receding contact angle $\theta_r$ when volume is withdrawn from the water drop.

Contact angles were measured on an OCA Video based contact angle system from FDS Future Digital Scientific Corporation using the sessile drop method. The contact angles herein refer to the advancing contact angles. Advancing angles are believed to be the most reliable measurements that can be made here. However, since there are many ways to measure contact angles, three different contact angles are presented which are important to understand surface characteristics: a) Static contact angles ($\theta_e$), b) Advancing contact angles ($\theta_a$), and c) Receding contact angles ($\theta_r$). FIG. 1A shows the static contact angle to be the angle when all participating phases (i.e. air, water and resist film) have reached their natural equilibrium positions and the three phase line is not moving. Reported are static contact angles with a calculated average from 5-10 measurements of a 2 µl ionized water drop. Advancing and receding (also called dynamic contact angles) are measured when the three phase line is in controlled motion by wetting the sample or by withdrawing the water over a pre-wetted surface, respectively. FIG. 1B and FIG. 1C show how the reported dynamic angles are calculated from an average of 3-5 measurements with the needle inside the droplet as it is increasing in volume ($\theta_a$) and decreasing in volume ($\theta_r$) (0 µl-20 µl) with a controlled rate of 0.1 µl/second, respectively.

One of the main objectives of using a topcoat is to prevent leaching of extractables from the resist into the immersion liquid. Extraction of resist components into water was performed using WEXA (Water Extraction Apparatus, see R. D. Allen et al., J. Photopolym. Sci. & Tech., 18(5), 2005, pp 615-619). Selected materials in the present invention were set in contact with water in a controlled reproducible manner (time, speed, volume, contact area, etc.). The water was thereafter collected and analyzed for extractables by Exygen Research using LC/MS/MS. Reported are the amount sulfonate extractables originating from the PAG (photo acid generator), which is a component of the resist. For ease of understanding, the amount is reported as percent extractable reduction using a topcoat composition of the present invention as compared without topcoat. In all cases, the extractables were much lower after the application of the topcoat.

Example 1

Synthesis of Poly(1,1,1,3,3,3-hexafluoroisopropyl methacrylate-co-methacrylic acid) (Polymer 1)

1,1,1,3,3,3-hexafluoroisopropyl methacrylate (4.72 grams, 0.02 mole), methacrylic acid (1.72 grams, 0.02 mole) and 20 grams of tetrahydrofuran (THF) were placed in a round bottom flask equipped with a condenser and a nitrogen inlet.

2,2'-Azobisisobutyronitrile (AIBN) (0.26 grams, 0.0016 mole) and 1-dodecanethiol (0.24 grams, 0.0012 mole) were added to this solution and stirred until dissolved. The solution was then degassed using four vacuum/nitrogen purges. The contents were then heated to reflux for 18 hours. Afterwards, the solution was added dropwise into hexanes (500 ml). The precipitated polymer was filtered (frit), washed twice with hexanes (50 ml) and dried under vacuum at 60° C. Yield: 5.2 grams. Mn=4,721. Polydispersity 1.55. Tg: 150° C.

Examples 2-11

Synthesis of Polymers 2-11

These polymers were synthesized by the same procedure described for Polymer 1, starting with appropriate monomers in required quantities.

Example 12

Synthesis of Poly(norbornane-alt-maleic acid 4,4,5,5,5-pentafluoro-1-pentanol monoester) Topcoat (Polymer 12)

a. Synthesis of Norbornene-Alt-Maleic Anhydride Copolymer:

Synthesis of Poly(norbornene-alt-maleic anhydride-V601 initiator). A mixture of norbornene (37.66 g; 0.4 mole), maleic anhydride (39.22 g; 0.4 mol), 80 g ethyl acetate, and 80 g tetrahydrofuran were heated to reflux in a 500 mL round-bottom flask with stirring under a nitrogen atmosphere. The mixture was cooled slightly, and dimethyl 2,2'-azobisisobutyrate (V-601) (3.68 g; 16 mmol) was added all in one portion. The mixture was nitrogen flushed and heated to reflux under nitrogen for 19 hours. The reaction mixture was cooled to room temperature, diluted with 100 mL of tetrahydrofuran, then precipitated into 3 liters of stirred 2-propanol. The resulting solid was collected, washed with three 150 mL portions of 2-propanol and residual solvent removed under vacuum (100 milliTorr) to obtain a constant weight. A yield of 74.65 grams of a white polymer powder was obtained.

b. Norbornene-alt-maleic anhydride copolymer (above) (1.0 g) was heated in a 100 mL flask with 9 grams of 4,4,5,5,5-pentafluoro-1-pentanol and 50 mg of 4-dimethylaminopyridine, at reflux, under nitrogen for 21 hours. The reaction mixture was cooled, stirred with 0.5 g of Amberlyst-15 for 2.5 hours, and the solution was filtered through glass wool. This solution was diluted with 5.9 g of n-butanol and filtered through 0.2 micron PTFE filter.

Example 13

Synthesis of Terpolymer-Polymer 13

Norbornene (4.70 grams, 0.05 mole), acrylic acid (2.16 grams, 0.030 mole), 1,1,1,3,3,3-hexafluoroisopropyl methacrylate (4.44 grams, 0.020 mole) and 12 grams of ethyl acetate were placed in a round bottom flask equipped with a condenser and a nitrogen inlet. 2,2'-Azobisisobutyronitrile (AIBN) (0.65 grams, 0.004 mole) was added to this solution and stirred until dissolved. The solution was then degassed using four vacuum/nitrogen purges. The contents were then heated to reflux for 18 hours. Afterwards, the solution was added dropwise into hexanes (500 ml). The precipitated polymer was filtered (frit), washed twice with hexanes (50 ml) and dried under vacuum at 60° C. Yield 6.1 grams. Composition: 20/48/32 by Inverse Gated $^{13}C$ NMR, Mn=4,180. Polydispersity 2.05. Tg: 137° C.

Example 14

Synthesis of Cage Compound 1 a. Octakis(dimethylsilyloxy)silsesquioxane (Q8M8H) (2.54 grams, 0.0025 mole), cis-5-norbornene-endo-2,3-dicarboxylic anhydride (3.28 g, 0.020 mole), and tetrahydrofuran (THF) (20 ml) were placed in a round bottom flask equipped with a magnetic stirrer, nitrogen inlet, and a water condenser. Platinum(0)-1,3-divinyl-1,1,3,3-tetramethyldisiloxane complex in xylene (1 ml) was added to this mixture and stirred at room temperature for 1 hour and heated to reflux for 1 more hour. According to the IR spectrum of the reaction product, the reaction was complete. The solvent was removed in a rotary evaporator and the residue was dried under vacuum at room temperature.
b. To the above solid, 2,2,3,3,4,4-heptafluoro-1-butanol (42.75 g), dimethylamino pyridine (DMAP) (50 mg) were added and heated to reflux for 16.5 hours. This solution was stirred with Amberlist 15 (washed, 2 g) for 5 hours and filtered through a 0.2 micron syringe filter.

Example 15

Extraction Evaluation of Topcoat Compositions

Three 5 inch silicon wafers were coated with 120 nm thick film of a commercial 193 nm positive resist (Resist A). All three wafers were post apply baked at 110° C. for 90 seconds (PAB). A 3 wt % solution of Polymer 1 in 4-Methyl 2-Pentanol was coated over one of the resist coated wafers and a 3 wt % solution of Cage compound 1 in 1-Butanol was coated over the second of the resist coated wafers. The wafers with topcoats were topcoat baked at 90° C. for 60 seconds (TB). The three wafers were thereafter placed into the WEXA tool and the water was analyzed for sulfonate extractables. Table 2 shows the reduction of leached extractables from the resist as compared to not using topcoat. Polymer 1 eliminates extraction whereas Cage Compound 1 let through only 15% of sulfonates as compared to without topcoat.

TABLE 2

Effect of using topcoat compositions covered in this invention on sulfonate extraction.

| Sample | Sulfonate extractables |
|---|---|
| Resist only | 100% |
| Resist A + Polymer 1 | 0% |
| Resist A + Cage Compound 1 | 15% |

Example 16

Contrast Evaluation of Polymer 5 and Polymer 12 Topcoat Compositions

Figure 2:
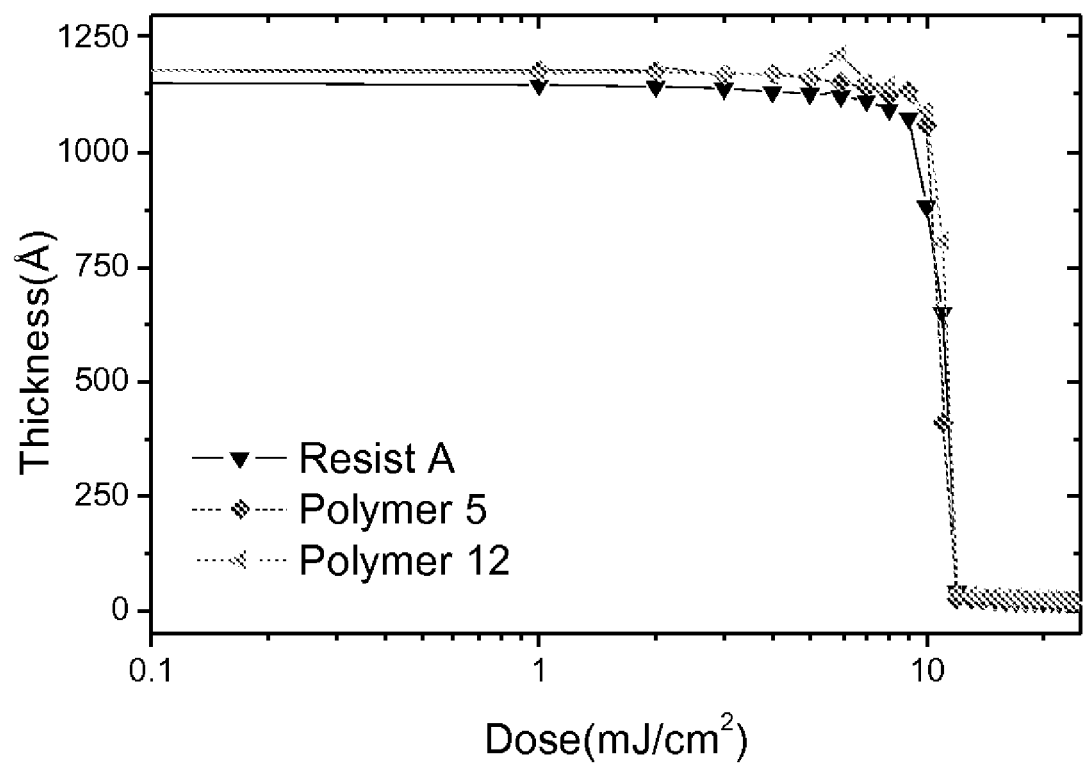
FIG. 2 is a plot depicting contrast curves showing a thickness response as a function of dose of Resist A with and without the polymer topcoat composition.

Three 5 inch silicon wafers with an anti-reflective coating (ARC) were coated with 110 nm thick film of a commercial 193 nm positive resist (Resist A). All three wafers were post apply baked at 110° C. for 90 seconds (PAB). A 3 wt % solution of Polymer 5 in 4-Methyl 2-Pentanol was coated over one of the resist coated wafers and a 3 wt % solution of Polymer 12 in 4-Methyl 2-Pentanol was coated over the second of the resist coated wafers. All three wafers were topcoat baked at 105° C. for 60 seconds (TB). All three wafers were thereafter exposed open frame (no mask) to create an array of doses at 193 nm and post expose baked at 110° C. for 90 seconds (PEB). The wafers were then developed for 60 seconds in a 0.26 N TMAH developer. The thickness change caused by increased exposure dose was measured and two contrast curves were plotted. FIG. 2 shows that the contrast curves in all three cases were very similar indicating the absence of any significant interference of the topcoat with the resist.

Example 17

Contrast Evaluation of Cage Compound 1 Topcoat Composition

Figure 3:
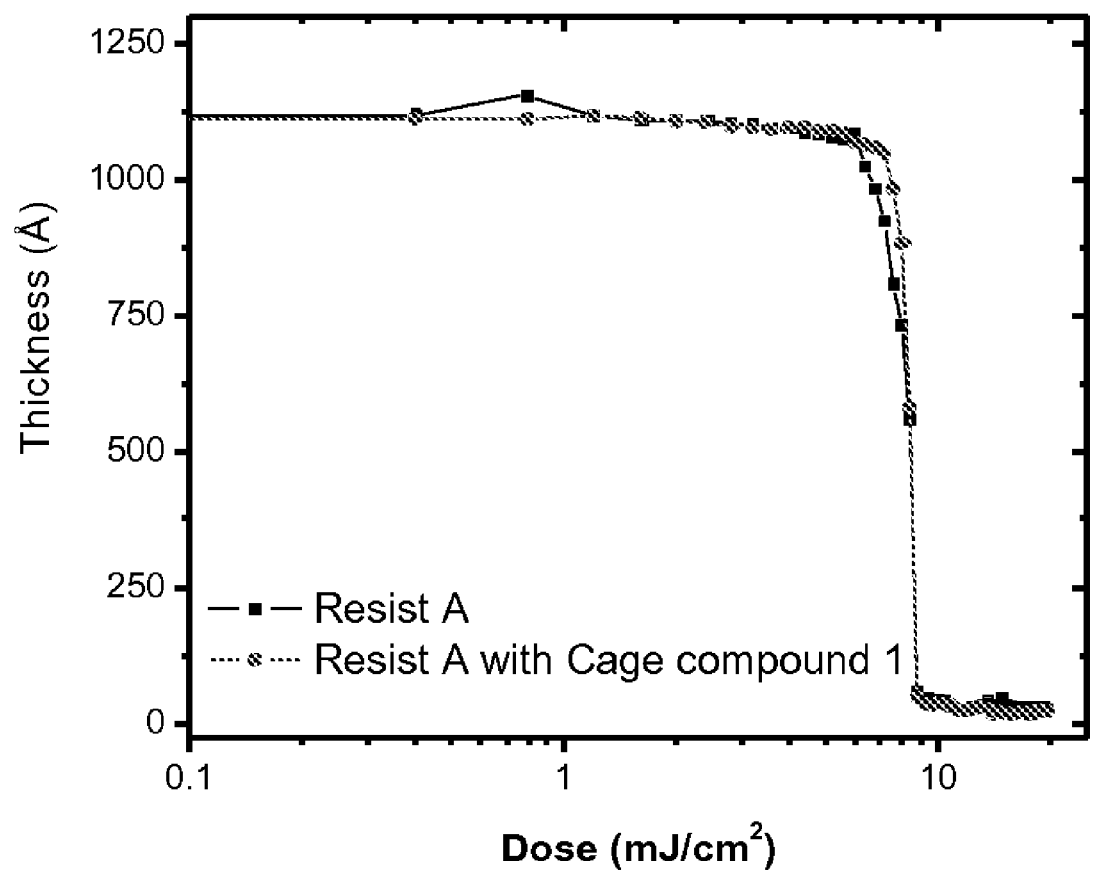
FIG. 3 is a plot depicting contrast curves showing thickness response as a function of dose of Resist A with and without the cage compound topcoat composition.

Two 5 inch silicon wafers with an anti-reflective coating (ARC) were coated with 110 nm thick film of a commercial 193 nm positive resist (Resist A). Both wafers were post apply baked at 110° C. for 90 seconds (PAB). A 3 wt % solution of Topcoat composition 1 in 1-Butanol was coated over one of the resist coated wafers. Both wafers were topcoat baked at 90° C. for 60 seconds (TB). Both wafers were thereafter exposed open frame (no mask) to create an array of doses at 193 nm and post expose baked at 110° C. for 90 seconds (PEB). The wafers were then developed for 60 seconds in a 0.26 N TMAH developer. The thickness change caused by increased exposure dose was measured and two contrast curves were plotted. The contrast curves show improvement of contrast using Cage compound 1 topcoat composition as depicted in FIG. 3.

Example 18

Figure 4A:
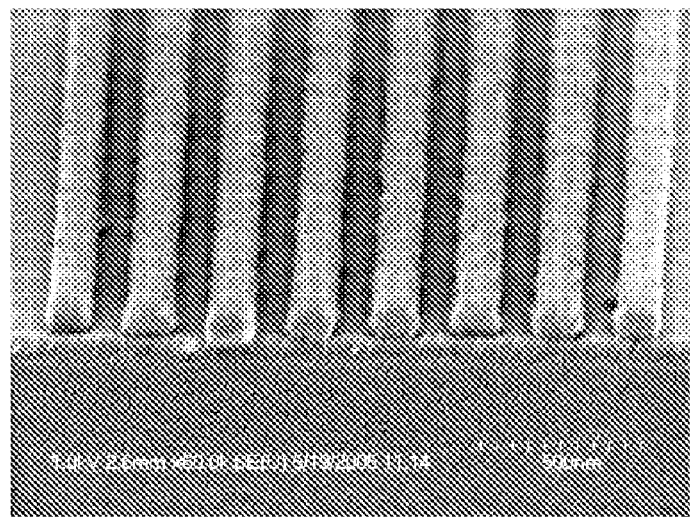
FIG. 4A is a photograph depicting a resist without a cage compound topcoat composition at 130 nm 1:1 line/space arrays, dry exposure at 193 nm of the resist.
Figure 4B:
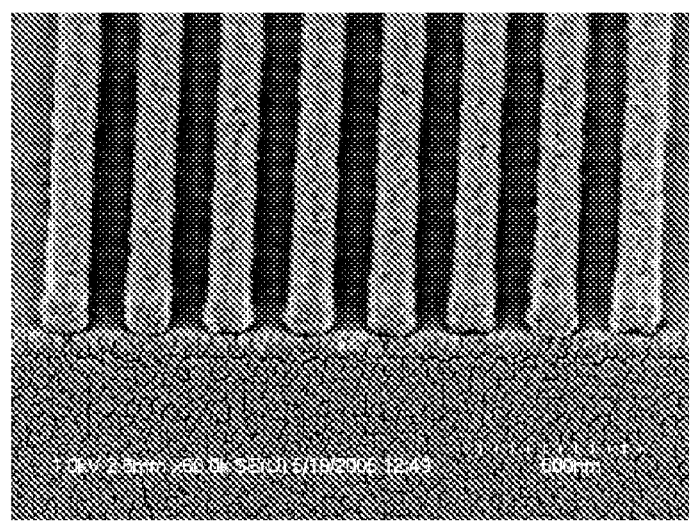
FIG. 4B is a photograph depicting a resist with a cage compound topcoat composition at 130 nm 1:1 line/space arrays, dry exposure at 193 nm of the resist.

Lithographic Evaluation of Cage Compound Topcoat Composition on Commercial Resist at 193 nm Dry Exposure A 5 inch silicon wafer with an ARC layer was coated with 110 nm thick film of a commercial 193 nm positive resist (Resist A). The wafer was post apply baked at 110° C. for 90 seconds (PAB). A 3 wt % solution of Cage compound 1 in n-Butanol was coated over the resist and baked at 90° C. for 60 seconds (TB). The wafer was exposed dry through a mask pattern at 193 nm and then post expose baked at 110° C. for 90 seconds (PEB). The wafer was subsequently developed for 60 seconds in 0.26 N TMAH developer. High resolution images were obtained. Improvement was observed of imaging performance as compared to Resist A imaged without Cage compound 1 topcoat composition with the same process conditions (no topcoat bake). FIG. 4A and FIG. 4B show how the topcoat made the profile more square, less rough and resulted in less thickness loss.

Example 19

Figure 5A:
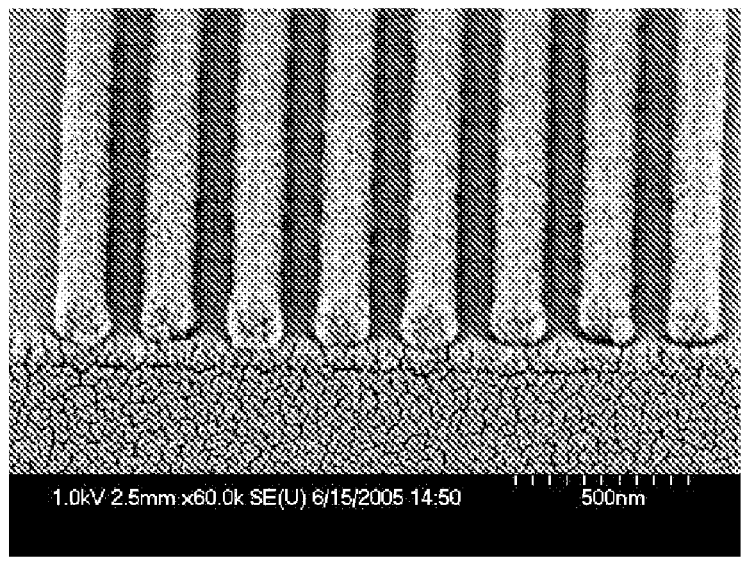
FIG. 5A is a photograph depicting a resist without a polymer topcoat composition at 130 nm 1:1 line/space arrays, dry exposure at 193 nm of the resist.
Figure 5B:
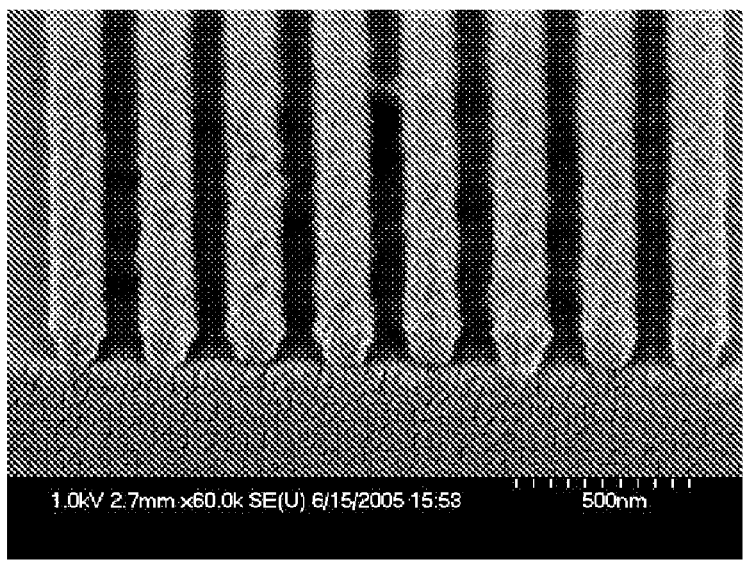
FIG. 5B is a photograph depicting a resist with a polymer topcoat composition at 130 nm 1:1 line/space arrays, dry exposure at 193 nm of the resist.

Lithographic Evaluation of Polymer 12 Topcoat Composition on Commercial Resist at 193 nm Dry Exposure A 5 inch silicon wafer with an ARC layer was coated with 110 nm thick film of a commercial 193 nm positive resist (Resist A). The wafer was post apply baked at 110° C. for 90 seconds (PAB). A 3 wt % solution of Polymer 12 in 4-Methyl-2-Pentanol was coated over the resist and baked at 90° C. for 60 seconds (TB). The wafer was exposed dry through a mask pattern at 193 nm and then post expose baked at 110° C. for 90 seconds (PEB). The wafer was subsequently developed for 60 seconds in 0.26 N TMAH developer. High resolution images were obtained. Improvement was observed of imaging performance as compared to Resist A imaged without Polymer 12 topcoat composition with the same process conditions (no topcoat bake). FIG. 5A and FIG. 5B show how the topcoat made the profile more square, less rough and resulted in less thickness loss.

Figure 6A:
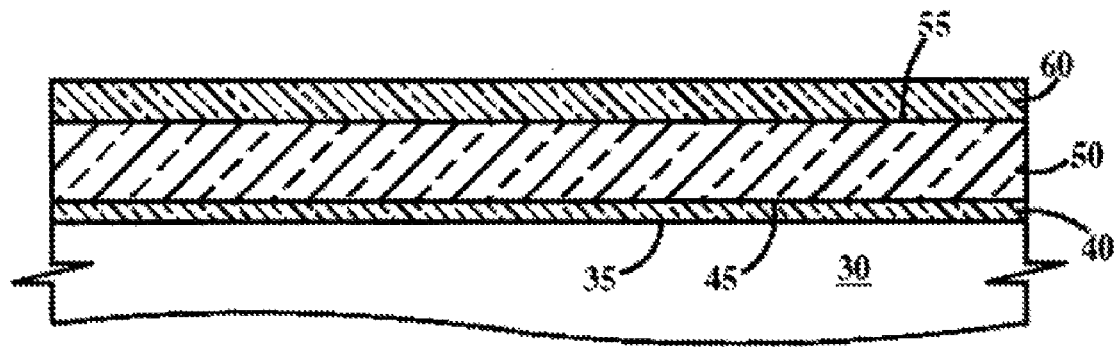
FIGS. 6A-6C depict cross-sectional views illustrating semiconductor manufacturing.
Figure 6B:
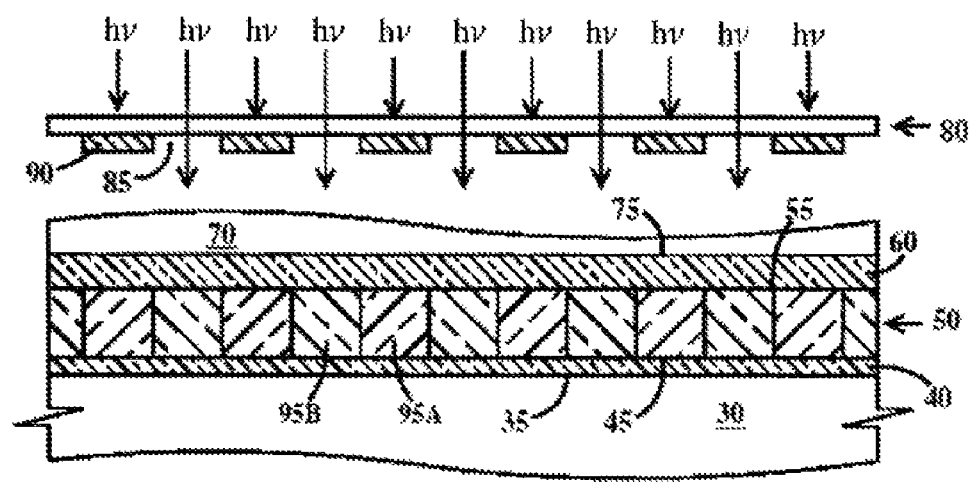
Figure 6C:
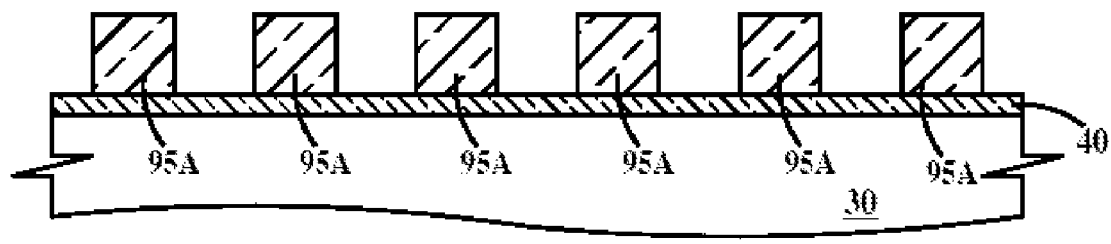

FIG. 6A through 6C are partial cross-sectional views illustrating a semiconductor manufacturing process according to the present invention. In FIG. 6A, a substrate 30 is provided. In one example, substrate 30 is a semiconductor substrate. Examples of semiconductor substrates include but are not limited to bulk (single crystal) silicon wafers and silicon on insulator (SOI) wafers. Formed on a top surface 35 of substrate 30 is an optional anti-reflective coating (ARC) 40. In one example, ARC 40 is spin applied and a post ARC apply bake (heated above room temperature to remove most of the ARC solvent) performed. Formed on a top surface 45 of ARC 40 is a photoresist layer 50. In one example, photoresist layer 50 is spin applied and a post photoresist apply bake, also known as a pre-exposures bake or a pre-bake (heated above room temperature to remove most of the photoresist solvent) performed. Next a topcoat 60 is formed on a top surface 55 of photoresist layer 50. In one example, topcoat 60 is spin applied and a post topcoat apply bake (heated above room temperature to remove most of the topcoat solvent) performed. Topcoat 60 comprises materials as described supra.

In FIG. 6B, a layer of immersion fluid 70 is formed over a top surface 75 of topcoat 60 in an immersion photolithography tool (see description infra). An example of an immersion fluid is water, with or without additives. Light of a wavelength that photoresist layer 50 is sensitive to is passed through a photomask 80. Photo mask 80 has clear regions 85 that transmit the light and opaque regions 90 that block the light. Exposure of photoresist layer 50 to light through mask 80 forms unexposed regions 95A of photoresist layer 50 and exposed regions 95B of photoresist layer 50. Exposed regions 95B are also known as latent image regions. An optional post exposure bake (heated above room temperature to drive the photoresist chemistry) may be performed. Although a positive photoresist is shown in FIG. 6B, the present invention works equally well with negative photoresist systems or dual tone photoresist systems. In negative photoresist systems, the photoresist will develop away where it is not exposed to light, so a photomask of polarity opposite to that illustrated in FIG. 6B is required. Dual tone resists can act either negatively or positively depending upon the developer system used.

In FIG. 6C, substrate 30 is removed from the immersion photolithography tool and photoresist layer 50 developed to remove exposed regions 95B (see FIG. 3B) and leave behind unexposed regions 95A. In one example the developer comprises an aqueous solution of a base such as TMAH. Topcoat 60 (see FIG. 6B) is also removed by the developer. Optionally, topcoat layer 60 may be removed separately prior to development of the exposed photoresist layer 50. An optional post development bake, (heated above room temperature to harden the photoresist images) may be performed.

While the exposure of the photoresist layer was described in the context of an immersion photolithography system, the topcoat compositions of the present invention also have utility in conventional (non-immersion) photolithography system as described supra, as a protective coating against environmental contamination from particulates, water vapor, and chemical vapors that could degrade the imaging process or cause imperfections in the photoresist images and ultimately yield or reliability defects in the fabricated product.

Figure 7:
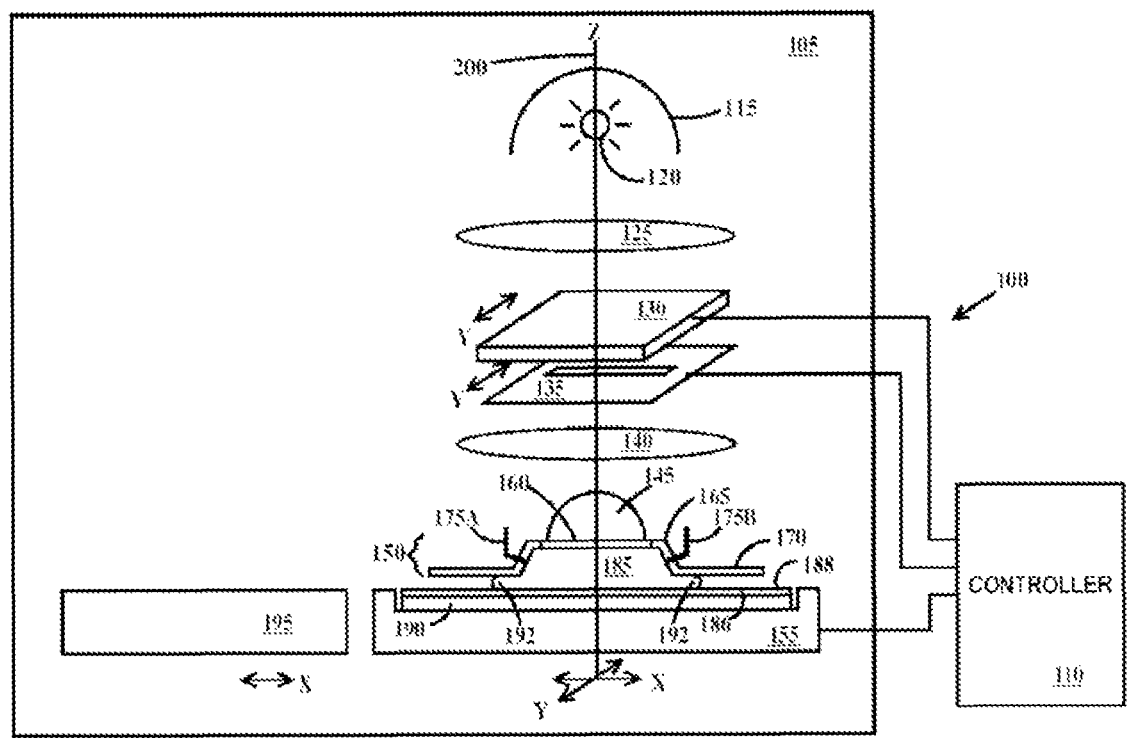
FIG. 7 depicts an immersion photolithography system.

FIG. 7 is a diagram of an exemplary immersion photolithographic system that may be used to process a semiconductor wafer having a topcoat layer according to the present invention. In FIG. 7, an immersion lithography system 100 includes a controlled environment chamber 105 and a controller 110. Contained within controlled environment chamber 105 is a focusing mirror 115, a light source 120, a first focusing lens (or set of lenses) 125, a mask 130, an exposure slit 135, a second focusing lens (or set of lenses) 140, a final focusing lens 145, an immersion head 150 and a wafer chuck 155. Immersion head 150 includes a transparent window 160, a central chamber portion 165, a surrounding plate portion 170, an immersion fluid inlet 175A and an immersion fluid outlet 175B. An immersion fluid 185 fills central chamber portion 165 and contacts a photoresist layer 186 on a top surface 188 of a wafer 190, and the photoresist layer 186 includes a topcoat formed of a maleic acid mono ester resins according to the present invention. Alternatively, wafer 190 may have an ARC formed on top surface 188 and photoresist layer 186 is then be formed on a top surface of the ARC. In one example, immersion fluid 185 includes water. Plate portion 170 is positioned close enough to photoresist layer 186 to form a meniscus 192 under plate portion 170. Window 160 must be transparent to the wavelength of light selected to expose photoresist layer 186.

Focusing mirror 115, light source 120, first focusing lens 125, a mask 130, exposure slit 135, second focusing lens 140, final focusing lens 145, and immersion head 150 are all aligned along an optical axis 200 which also defines a Z direction. An X direction is defined as a direction orthogonal to the Z direction and in the plane of the drawing. A Y direction is defined as a direction orthogonal to both the X and Z directions. Wafer chuck 155 may be moved in the X and Y directions under the direction of controller 110 to allow formation of regions of exposed and unexposed photoresist in photoresist layer 186. As an XY-stage moves, new portions of photoresist layer 186 are brought into contact with immersion fluid 185 and previously immersed portions of the photoresist layer are removed from contact with the immersion fluid. Mask 130 and slit 135 may be moved in the Y direction under the control of controller 110 to scan the image (not shown) on mask 130 onto photoresist layer 186. In one example, the image on mask 130 is a 1× to a 10× magnification version of the image to be printed and includes one or multiple integrated circuit chip images.

When exposure is complete, wafer 190 is removed from controlled environment chamber 105 without spilling immersion fluid 185. To this end, controlled environment chamber 105 also includes a cover plate 195 that may be moved to first abut with wafer chuck 155 and then moved with the wafer chuck as the wafer chuck is moved out of position from under immersion head 150, the cover plate replacing the wafer chuck under immersion head 150.

The topcoat compositions of the present invention may be used with other types of immersion lithography tools and example of which is an immersion lithography tool wherein the immersion fluid is dispensed onto the wafer from openings in the lens barrel surrounding the lens.

Unless otherwise indicated, this invention is not limited to specific compositions, components, or process steps. It should also be noted that the singular forms "a" and "the" are intended to encompass plural referents, unless the context clearly dictates otherwise. The terminology used herein is for the purpose of describing particular embodiments only and is not intended to be limiting.

In this specification and in the claims that follow, reference will be made to a number of terms, which shall be defined to have the following meanings:

As used herein, the phrase "having the formula" or "having the structure" is not intended to be limiting and is used in the same way that the term "comprising" is commonly used.

The term "alkyl" as used herein refers to a linear or branched, saturated hydrocarbon substituent that generally, although not necessarily, contains 1 to about 24 carbon atoms, such as methyl, ethyl, n-propyl, isopropyl, n-butyl, isobutyl, t-butyl, octyl, decyl, tetradecyl, hexadecyl, eicosyl, tetracosyl, and the like. Generally, although again not necessarily, alkyl groups herein contain 1 to about 12 carbon atoms. The term "lower alkyl" intends an alkyl group of 1 to 6 carbon atoms, and the term "cycloalkyl" intends a cyclic alkyl group, typically having 3 to 12, preferably 3 to 8, carbon atoms. The term "substituted alkyl" refers to alkyl substituted with one or more substituent groups, i.e., wherein a hydrogen atom is replaced with a non-hydrogen substituent group, and the terms "heteroatom-containing alkyl" and "heteroalkyl" refer to alkyl substituents in which at least one carbon atom is replaced with a heteroatom such as O, N, or S. If not otherwise indicated, the terms "alkyl" and "lower alkyl" include linear, branched, cyclic, unsubstituted, substituted, and/or heteroatom-containing alkyl and lower alkyl, respectively.

The term "alkylene" as used herein refers to a difunctional linear or branched saturated hydrocarbon linkage, typically although not necessarily containing 1 to about 24 carbon atoms, such as methylene, ethylene, n-propylene, n-butylene, n-hexylene, decylene, tetradecylene, hexadecylene, and the like. Preferred alkylene linkages contain 1 to about 12 carbon atoms, and the term "lower alkylene" refers to an alkylene linkage of 1 to 6 carbon atoms, preferably 1 to 4 carbon atoms. The term "substituted alkylene" refers to an alkylene linkage substituted with one or more substituent groups, i.e., wherein a hydrogen atom is replaced with a non-hydrogen substituent group, and the terms "heteroatom-containing alkylene" and "heteroalkylene" refer to alkylene linkages in which at least one carbon atom is replaced with a heteroatom. If not otherwise indicated, the terms "alkylene" and "lower alkylene" include linear, branched, cyclic, unsubstituted, substituted, and/or heteroatom-containing alkylene and lower alkylene, respectively.

The term "alkoxy" as used herein refers to a group —O-alkyl wherein "alkyl" is as defined above.

The term "alicyclic" is used to refer to cyclic, non-aromatic compounds, substituents and linkages, e.g., cycloalkanes and cycloalkenes, cycloalkyl and cycloalkenyl substituents, and cycloalkylene and cycloalkenylene linkages. Often, the term refers to polycyclic compounds, substituents, and linkages, including bridged bicyclic, compounds, substituents, and linkages. Preferred alicyclic moieties herein contain 3 to about 30, typically 5 to about 14, carbon atoms. Unless otherwise indicated, the term "alicyclic" includes substituted and/or heteroatom-containing such moieties. It will be appreciated that the term "cyclic," as used herein, thus includes "alicyclic" moieties.

The term "heteroatom-containing" as in a "heteroatom-containing alkyl group" (also termed a "heteroalkyl" group) refers to a molecule, linkage or substituent in which one or more carbon atoms are replaced with an atom other than carbon, e.g., nitrogen, oxygen, sulfur, phosphorus or silicon, typically nitrogen, oxygen or sulfur. Similarly, the term "heteroalkyl" refers to an alkyl substituent that is heteroatom-containing, the term "heterocyclic" refers to a cyclic substituent that is heteroatom-containing. Examples of heteroalkyl groups include alkoxyalkyl, alkylsulfanyl-substituted alkyl, and the like.

Unless otherwise indicated, the term "hydrocarbyl" is to be interpreted as including substituted and/or heteroatom-containing hydrocarbyl moieties. "Hydrocarbyl" refers to univalent hydrocarbyl radicals containing 1 to about 30 carbon atoms, preferably 1 to about 18 carbon atoms, most preferably 1 to about 12 carbon atoms, including linear, branched, cyclic, alicyclic, and aromatic species. "Substituted hydrocarbyl" refers to hydrocarbyl substituted with one or more substituent groups, and the terms "heteroatom-containing hydrocarbyl" and "heterohydrocarbyl" refer to hydrocarbyl in which at least one carbon atom is replaced with a heteroatom.

By "substituted" as in "substituted alkyl," and the like, as alluded to in some of the aforementioned definitions, is meant that in the alkyl, or other moiety, at least one hydrogen atom bound to a carbon (or other) atom is replaced with a non-hydrogen substituent. Examples of suitable substituents herein include halo, hydroxyl, sulfhydryl, $C_1$-$C_{12}$ alkoxy, acyl (including $C_2$-$C_{12}$ alkylcarbonyl (—CO-alkyl)), acyloxy (—O-acyl), $C_2$-$C_{12}$ alkoxycarbonyl (—(CO)—O-alkyl), $C_2$-$C_{12}$ alkylcarbonato (—O—(CO)—O-alkyl), carboxy (—COOH), carbamoyl (—(CO)—$NH_2$), mono-substituted $C_1$-$C_{12}$ alkylcarbamoyl (—(CO)—NH($C_1$-$C_{12}$ alkyl)), di-substituted alkylcarbamoyl (—(CO)—N($C_1$-$C_{12}$ alkyl)$_2$), cyano (—C≡N), cyanato (—O—C≡N), formyl (—(CO)—H), amino (—$NH_2$), mono- and di-($C_1$-$C_{12}$ alkyl)-substituted amino, mono- and $C_2$-$C_{12}$ alkylamido (—NH—(CO)-alkyl), imino (—CR═NH where R═hydrogen, $C_1$-$C_{12}$ alkyl. etc.), alkylimino (—CR═N(alkyl), where R═hydrogen, alkyl, etc.), $C_1$-$C_{20}$ alkylsulfanyl (—S-alkyl; also termed "alkylthio"), $C_5$-$C_{18}$ arylsulfanyl (—S-aryl; also termed "arylthio"), $C_1$-$C_{20}$ alkylsulfinyl (—(SO)-alkyl), $C_1$-$C_{20}$ alkylsulfonyl ($SO_2$-alkyl), phosphono (—P(O)(OH)$_2$), and the hydrocarbyl moieties $C_1$-$C_{24}$ alkyl (preferably $C_1$-$C_{12}$ alkyl). In addition, the aforementioned functional groups may, if a particular group permits, be further substituted with one or more additional functional groups or with one or more hydrocarbyl moieties such as those specifically enumerated above. Analogously, the above-mentioned hydrocarbyl moieties may be further substituted with one or more functional groups or additional hydrocarbyl moieties such as those specifically enumerated. When the term "substituted" appears prior to a list of possible substituted groups, it is intended that the term apply to every member of that group.

The term "fluorinated" refers to replacement of a hydrogen atom in a molecule or molecular segment with a fluorine atom, and includes perfluorinated moieties. The term "perfluorinated" is also used in its conventional sense to refer to a molecule or molecular segment wherein all hydrogen atoms are replaced with fluorine atoms. Thus, a "fluorinated" methyl group encompasses —$CH_2F$ and —$CHF_2$ as well as the "perfluorinated" methyl group, i.e., —$CF_3$ (trifluoromethyl). The term "fluoroalkyl" refers to a fluorinated alkyl group, the term "fluoroalkylene" refers to a fluorinated alkylene linkage, the term "fluoroalicyclic" refers to a fluorinated alicyclic moiety, and the like. "Fluorocarbyl" refers to fluorinated hydrocarbyl group.

"Optional" or "optionally" means that the subsequently described circumstance may or may not occur, so that the description includes instances where the circumstance occurs and instances where it does not. For example, the phrase "optionally substituted" means that a non-hydrogen substituent may or may not be present on a given atom, and, thus, the description includes structures wherein a non-hydrogen substituent is present and structures wherein a non-hydrogen substituent is not present.

The term "acid-cleavable" refers to a molecular segment containing at least one covalent bond that is cleaved upon exposure to acid. Typically, the reaction of acid-cleavable groups herein with photogenerated acid occurs only, or is promoted greatly by, the application of heat. Those skilled in the art will recognize the various factors that influence the rate and ultimate degree of cleavage of acid-cleavable groups as well as the issues surrounding integration of the cleavage step into a viable manufacturing process. The product of the cleavage reaction is generally an acidic group, which, when present in sufficient quantities, imparts solubility to the polymers of the invention in basic aqueous solutions.

Analogously, the term "acid-inert" refers to a substituent that is not cleaved or otherwise chemically modified upon contact with photogenerated acid.

The terms "photogenerated acid" and "photoacid" are used interchangeably herein to refer to the acid that is created upon exposure of the present photoresist compositions to radiation, by virtue of the photoacid generator contained in the compositions.

The term "substantially transparent" as used to describe a polymer that is "substantially transparent" to radiation of a particular wavelength refers to a polymer that has an absorbance of less than about 5.0/micron, preferably less than about 3.0/micron, most preferably less than about 1.5/micron, at a selected wavelength.

For additional information concerning terms used in the field of lithography and lithographic compositions, see *Introduction to Microlithography*, Eds. Thompson et al. (Washington, D.C.: American Chemical Society, 1994).

It should be understood that the preceding is merely a detailed description of a number of preferred embodiments of the present invention and that numerous changes to the disclosed embodiments can be made in accordance with the disclosure herein without departing from the spirit or scope of the invention. The preceding description, therefore, is not meant to limit the scope of the invention in any respect. Rather, the scope of the invention is to be determined only by the issued claims and their equivalents.

What is claimed is:

1. An acid-inert compound comprising a compound selected from the group consisting of:

polymer and oligomers comprising the structure A1:

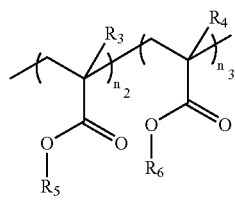

wherein
$R_3$ and $R_4$ independently represent a member selected from the group consisting of hydrogen, alkyl and fluoroalkyl;
$R_5$ represents an aqueous base soluble group comprising a functionality selected from the group consisting of sulfonamidyl and fluoroalcohol;
$R_6$ represents a fluorocarbyl moiety other than a fluorinated ether; and
$n_2$ and $n_3$ are integers that represent the number of repeat units, wherein $n_2+n_3=1$;

polymers and oligomers comprising the structure A2:

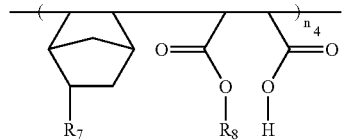

wherein
$R_7$ and $R_8$ independently represent a member selected from the group consisting of hydrogen and a fluorocarbyl moiety other than a fluorinated ether, provided that one of $R_7$ and $R_8$ is a fluorocarbyl moiety other than a fluorinated ether; and
$n_4$ is an integer that represents the number of repeat units;

polymers and oligomers comprising the structure A4:

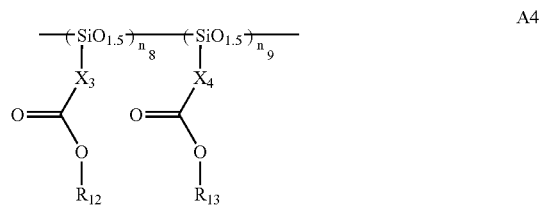

wherein
$X_3$ and $X_4$ independently represent a member selected from the group consisting of alkylene, cycloalkylene, heteroalkylene and heterocycloalkylene;
$R_{12}$ represents an aqueous base soluble group comprising a functionality selected from the group consisting of hydrogen, sulfonamidyl and fluoroalcohol;
$R_{13}$ represents a fluorocarbyl moiety other than a fluorinated ether; and
$n_8$ and $n_9$ are integers that represent the number of repeat units; and polymers and oligomers and a cage structure comprising the structure A5:

wherein
$X_5$ represents an alicyclic group;
$R_{14}$ represents an aqueous base soluble group comprising a functionality of sulfonamidyl;
$R_{15}$ represents a fluorocarbyl moiety other than a fluorinated ether; and
$n_{10}$ is an integer that represents the number of repeat units;

provided the compound does not comprise the structure:

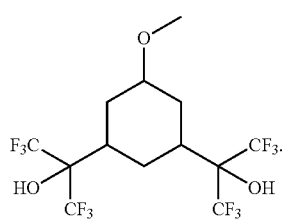

2. The compound according to claim 1, which comprises a polymer or oligomer having the structure A1:

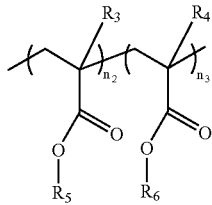

A1 wherein
- $R_3$ and $R_4$ independently represent a member selected from the group consisting of hydrogen, alkyl and fluoroalkyl;
- $R_5$ represents an aqueous base soluble group comprising a functionality of sulfonamindyl;
- $R_6$ represents a fluorocarbyl moiety other than a fluorinated ether; and
- $n_2$ and $n_3$ are integers that represent the number of repeat units, wherein $n_2+n_3=1$.

3. The compound according to claim 1, which comprises a polymer or oligomer having the structure A2:

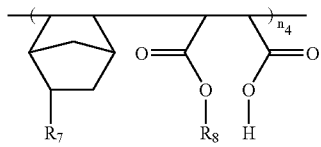

A2 wherein
- $R_7$ and $R_8$ independently represent a member selected from the group consisting of hydrogen and a fluorocarbyl moiety other than a fluorinated ether, provided that one of $R_7$ and $R_8$ is a fluorocarbyl moiety other than a fluorinated ether; and
- $n_4$ is an integer that represents the number of repeat units.

4. The compound according to claim 1, which comprises a polymer or oligomer having the structure A4:

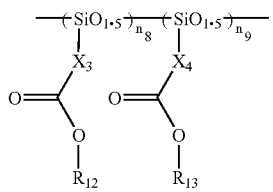

A4 wherein
- $X_3$ and $X_4$ independently represent a member selected from the group consisting of alkylene, cycloalkylene, heteroalkylene and heterocycloalkylene;
- $R_{12}$ represents an aqueous base soluble group comprising a functionality selected from the group consisting of hydrogen, sulfonamidyl and fluoroalcohol;
- $R_{13}$ represents a fluorocarbyl moiety other than a fluorinated ether; and
- $n_8$ and $n_9$ are integers that represent the number of repeat units.

5. The compound according to claim 1, which comprises a polymer or oligomer or a cage structure having the structure A5:

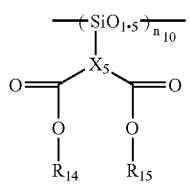

A5 wherein
- $X_5$ represents an alicyclic group;
- $R_{14}$ represents an aqueous base soluble group comprising a functionality selected from the group consisting of hydrogen, sulfonamidyl and fluoroalcohol;
- $R_{15}$ represents a fluorocarbyl moiety other than a fluorinated ether; and
- $n_{10}$ is an integer that represents the number of repeat units.

6. The compound according to claim 1, which comprises a compound selected from the group consisting of:

compounds of the formula:

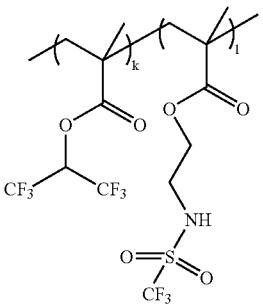

wherein k:l=30-50 mole %:70-50 mole %, wherein k+l=100 mole %;

and compounds of the formula:

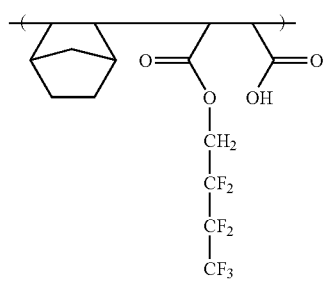

and the compound of the formula:
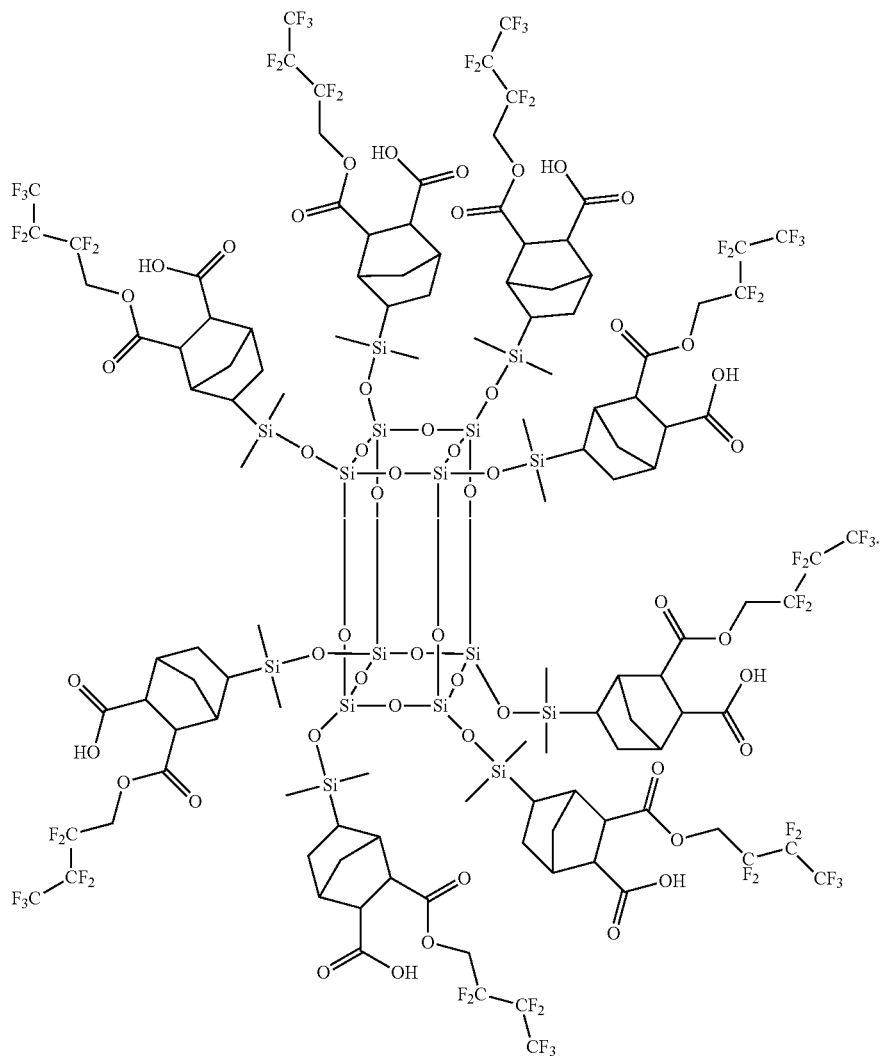
Cage Compound 1
7. A topcoat composition comprising an acid-inert compound according to claim 1 and a solvent.
8. The topcoat composition according to claim 7, comprising an acid-inert compound having the structure:
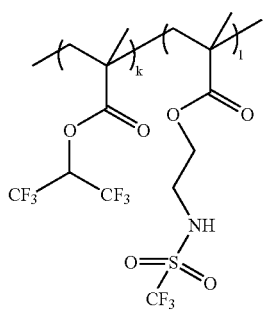
wherein k:l=30-50 mole %:70-50 mole %, wherein k+l=100 mole %.

9. The topcoat composition according to claim 7, comprising the acid-inert compound:

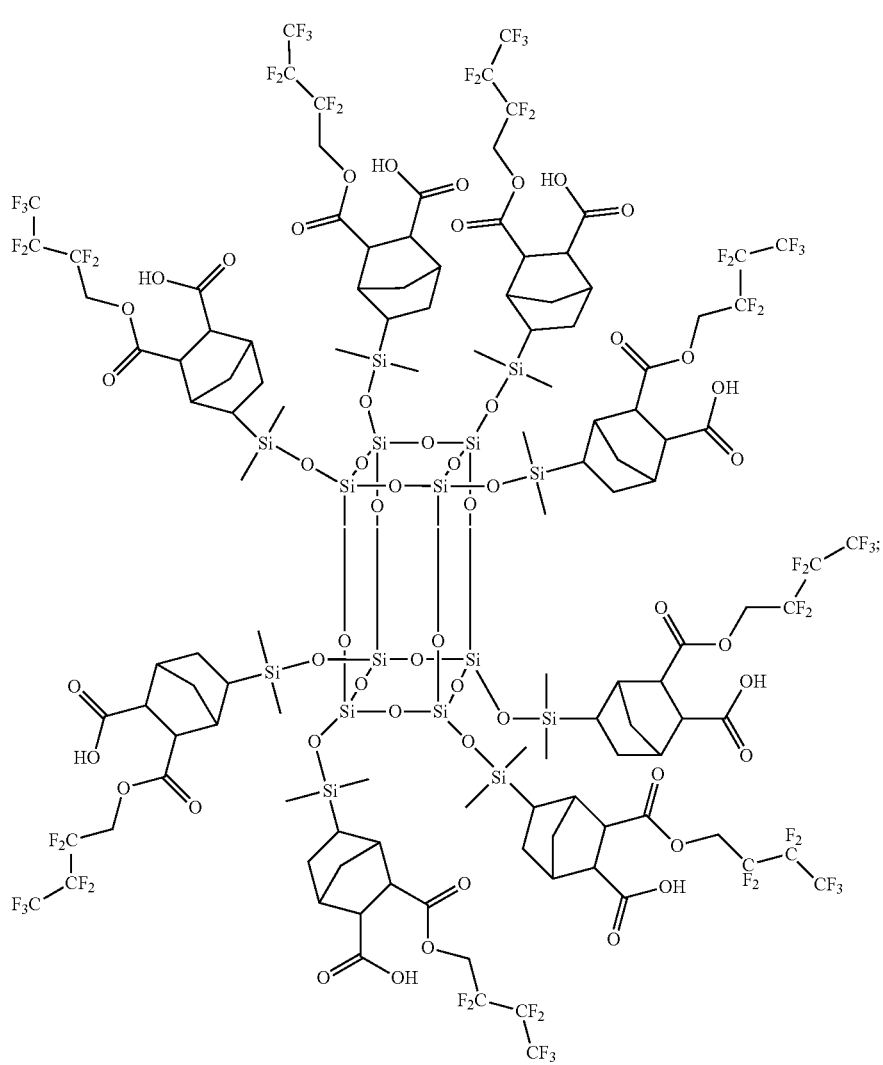

Cage Compound 1

10. The topcoat composition according to claim 7, wherein the solvent includes a hydrocarbon alcohol.

11. The topcoat composition according to claim 10, wherein the hydrocarbon alcohol is selected from the group consisting of 1-butanol, 2,3-dimethyl-2-butanol, 1-pentanol, 4-methyl-2-pentanol, 2-ethyl hexanol, ethylene glycol, 1,2-butanediol, 1,3-butanediol, 1,4-butanediol, 1,2-propanediol and 1,3-propanediol.

12. A method of forming a patterned material layer on a substrate, said method comprising the following steps:
   a) providing a substrate having a material layer on a surface thereof;
   b) depositing a photoresist composition on the substrate to form a photoresist layer on the material;
   c) applying the topcoat composition according to claim 8 to the photoresist layer, thereby forming a coated substrate;
   d) patternwise exposing the coated substrate to imaging radiation;
   e) optionally post-exposure baking of said coated substrate;
   f) contacting the coated substrate with an aqueous alkaline developer, whereby the topcoat composition and a portion of the photoresist layer are removed from the coated substrate, thereby forming a pattern in the photoresist layer; and
   g) transferring the pattern in the photoresist layer to the material layer.

13. The method according to claim 12, which is carried out under immersion lithography conditions.

14. The method according to claim 13, wherein the acid-inert compound includes a polymer or oligomer having the structure A1:

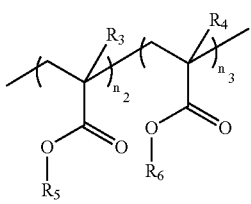

A1 wherein
- $R_3$ and $R_4$ independently represent a member selected from the group consisting of hydrogen, alkyl and fluoroalkyl;
- $R_5$ represents an aqueous base soluble group comprising a functionality of sulfonamidyl;
- $R_6$ represents a fluorocarbyl moiety other than a fluorinated ether; and
- $n_2$ and $n_3$ are integers that represent the number of repeat units wherein $n_2+n_3=1$.

15. The method according to claim 13, wherein the acid-inert compound includes a polymer or oligomer having the structure A2:

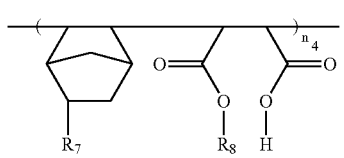

A2 wherein
- $R_7$ and $R_8$ independently represent a member selected from the group consisting of hydrogen and a fluorocarbyl moiety other than a fluorinated ether, provided that one of $R_7$ and $R_8$ is a fluorocarbyl moiety other than a fluorinated ether; and
- $n_4$ is an integer that represents the number of repeat units.

16. The method according to claim 13, wherein the acid-inert compound includes a polymer or oligomer having the structure A4:

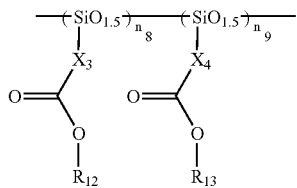

A4 wherein
- $X_3$ and $X_4$ independently represent a member selected from the group consisting of alkylene, cycloalkylene, heteroalkylene and heterocycloalkylene;
- $R_{12}$ represents an aqueous base soluble group comprising a functionality selected from the group consisting of hydrogen, sulfonamidyl and fluoroalcohol;
- $R_{13}$ represents a fluorocarbyl moiety other than a fluorinated ether; and
- $n_8$ and $n_9$ are integers that represent the number of repeat units.

17. The method according to claim 13, wherein the acid-inert compound includes a polymer or oligomer or a cage structure having the structure A5:

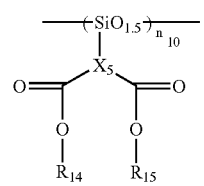

A5 wherein
- $X_5$ represents an alicyclic group;
- $R_{14}$ represents an aqueous base soluble group comprising a functionality selected from the group consisting of hydrogen, sulfonamidyl and fluoroalcohol;
- $R_{15}$ represents a fluorocarbyl moiety other than a fluorinated ether; and
- $n_{10}$ is an integer that represents the number of repeat units.

* * * * *

UNITED STATES PATENT AND TRADEMARK OFFICE
CERTIFICATE OF CORRECTION

PATENT NO. : 8,034,532 B2
APPLICATION NO. : 11/380744
DATED : October 11, 2011
INVENTOR(S) : Allen et al.

It is certified that error appears in the above-identified patent and that said Letters Patent is hereby corrected as shown below:

Column 2, line 63, "≧" should read -- ≥ --.

Column 6, line 5, "Polymer     2     (a:b=60:40);" should read -- Polymer 2 (a:b=60:40); --.

Column 25, line 60, "claim 8" should read -- claim 7 --.

Signed and Sealed this
Seventh Day of August, 2012

David J. Kappos
*Director of the United States Patent and Trademark Office*

UNITED STATES PATENT AND TRADEMARK OFFICE
CERTIFICATE OF CORRECTION

PATENT NO. : 8,034,532 B2
APPLICATION NO. : 11/380744
DATED : October 11, 2011
INVENTOR(S) : Allen et al.

Page 1 of 1

It is certified that error appears in the above-identified patent and that said Letters Patent is hereby corrected as shown below:

In the Claims

Column 19, line 56, "wherein $n_2 + n_3 = 1$"; should read -- wherein $n_2 + n_3$ represents 100 mole % --

Column 21, line 25, "wherein $n_2 + n_3 = 1$"; should read -- wherein $n_2 + n_3$ represents 100 mole % --

Column 27, line 8, "wherein $n_2 + n_3 = 1$"; should read -- wherein $n_2 + n_3$ represents 100 mole % --

Signed and Sealed this
Tenth Day of December, 2013

Margaret A. Focarino
*Commissioner for Patents of the United States Patent and Trademark Office*